US012633499B2

(12) United States Patent
Matsudo et al.

(10) Patent No.: US 12,633,499 B2
(45) Date of Patent: May 19, 2026

(54) PLASMA PROCESSING DEVICE AND PLASMA PROCESSING METHOD

(71) Applicant: TOKYO ELECTRON LIMITED, Tokyo (JP)

(72) Inventors: Tatsuo Matsudo, Yamanashi (JP); Jun Yamawaku, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 486 days.

(21) Appl. No.: 17/928,762

(22) PCT Filed: Mar. 15, 2021

(86) PCT No.: PCT/JP2021/010386
§ 371 (c)(1),
(2) Date: Nov. 30, 2022

(87) PCT Pub. No.: WO2021/246020
PCT Pub. Date: Dec. 9, 2021

(65) Prior Publication Data
US 2023/0230809 A1      Jul. 20, 2023

(30) Foreign Application Priority Data

Jun. 1, 2020      (JP) ................................. 2020-095540

(51) Int. Cl.
*H01J 37/32* (2006.01)

(52) U.S. Cl.
CPC .. *H01J 37/32357* (2013.01); *H01J 37/32422* (2013.01); *H01J 37/32449* (2013.01);
(Continued)

(58) Field of Classification Search
CPC ........... H01J 37/32357; H01J 37/32422; H01J 37/32449; H01J 37/32541;
(Continued)

(56) References Cited

U.S. PATENT DOCUMENTS 8,207,470 B2      6/2012   Jeon et al.
8,440,571 B2 *    5/2013   Weidman .......... H01L 21/02329
                                                      438/767
(Continued)

FOREIGN PATENT DOCUMENTS

KR      10-2008-0000684 A      1/2008
KR      10-2011-0083049 A      7/2011
WO      WO 2006/129643 A1      12/2006

OTHER PUBLICATIONS

PCT International Search Report and Written Opinion, PCT Application No. PCT/JP2021/010386, May 25, 2021, 13 pages (with English Translation of PCT International Search Report).

*Primary Examiner* — Rudy Zervigon
(74) *Attorney, Agent, or Firm* — Fenwick & West LLP

(57) ABSTRACT

There is provided a plasma processing device comprising: a chamber; an upper electrode; a showerhead provided below the upper electrode, which divides an internal space of the chamber into a first space between the upper electrode and the showerhead and a second space below the showerhead, and provides a plurality of introduction ports for introducing a gas into the second space and a plurality of openings penetrating the showerhead so that the first space and the second space are in communication with each other; a substrate support portion configured to support a substrate in the second space; an ion trap provided between the upper electrode and the showerhead, wherein the ion trap provides a plurality of through holes arranged not to align with the plurality of openings of the showerhead; a first gas supply portion configured to supply a gas to a region in the first space between the upper electrode and the ion trap; a second gas supply portion configured to supply the showerhead with a gas to be introduced from the plurality of introduction ports into the second space; a power source configured to produce a power for generating plasma, and connected to the
(Continued)

upper electrode; and a switch configured to switchably connect the showerhead to one of a ground and the upper electrode.

10 Claims, 12 Drawing Sheets

(52) U.S. Cl.
CPC .. *H01J 37/32541* (2013.01); *H01J 37/32577* (2013.01); *H01J 2237/3321* (2013.01); *H01J 2237/3345* (2013.01)

(58) Field of Classification Search
CPC ......... H01J 37/32577; H01J 2237/3321; H01J 2237/3345; H01J 37/32091; H01J 37/3244; H01J 37/32174; H01J 37/32532; H01J 2237/334; H01J 15/00; H01J 37/32082; H01J 37/32623; H01J 37/32009; H01L 21/3065; H01L 21/67069; H05H 1/46; C23C 16/507; C23C 16/509; C23C 16/5096; C23C 16/45565; C23C 16/50; C23C 16/503; C23C 16/505; C23C 16/513; C23C 16/517

USPC ..... 118/723 E, 723 ER; 156/345.43, 345.44, 156/345.45, 345.46, 345.47
See application file for complete search history.

(56) References Cited

U.S. PATENT DOCUMENTS

| | | | | |
|---|---|---|---|---|
| 9,677,176 | B2 * | 6/2017 | Chandrasekharan ..... | B05B 1/18 |
| 2006/0102286 | A1 * | 5/2006 | Kim ...................... | C23C 16/507 |
| | | | | 156/345.35 |
| 2006/0118518 | A1 * | 6/2006 | Rusu ................. | H01L 21/31116 |
| | | | | 257/E21.252 |
| 2006/0236931 | A1 * | 10/2006 | Singh ................ | H01J 37/32009 |
| | | | | 156/345.48 |
| 2007/0277734 | A1 * | 12/2007 | Lubomirsky ......... | C23C 16/402 |
| | | | | 118/715 |
| 2009/0029564 | A1 | 1/2009 | Yamashita et al. | |
| 2009/0139453 | A1 | 6/2009 | Chen et al. | |
| 2010/0206846 | A1 * | 8/2010 | Nishimura ........ | H01L 21/02063 |
| | | | | 156/345.48 |
| 2012/0122302 | A1 * | 5/2012 | Weidman .......... | H01L 21/02274 |
| | | | | 118/723 R |
| 2017/0178867 | A1 * | 6/2017 | Kudela ............. | H01J 37/32532 |
| 2020/0035467 | A1 | 1/2020 | Shah et al. | |
| 2021/0222296 | A1 * | 7/2021 | Yamawaku ....... | H01J 37/32422 |

* cited by examiner

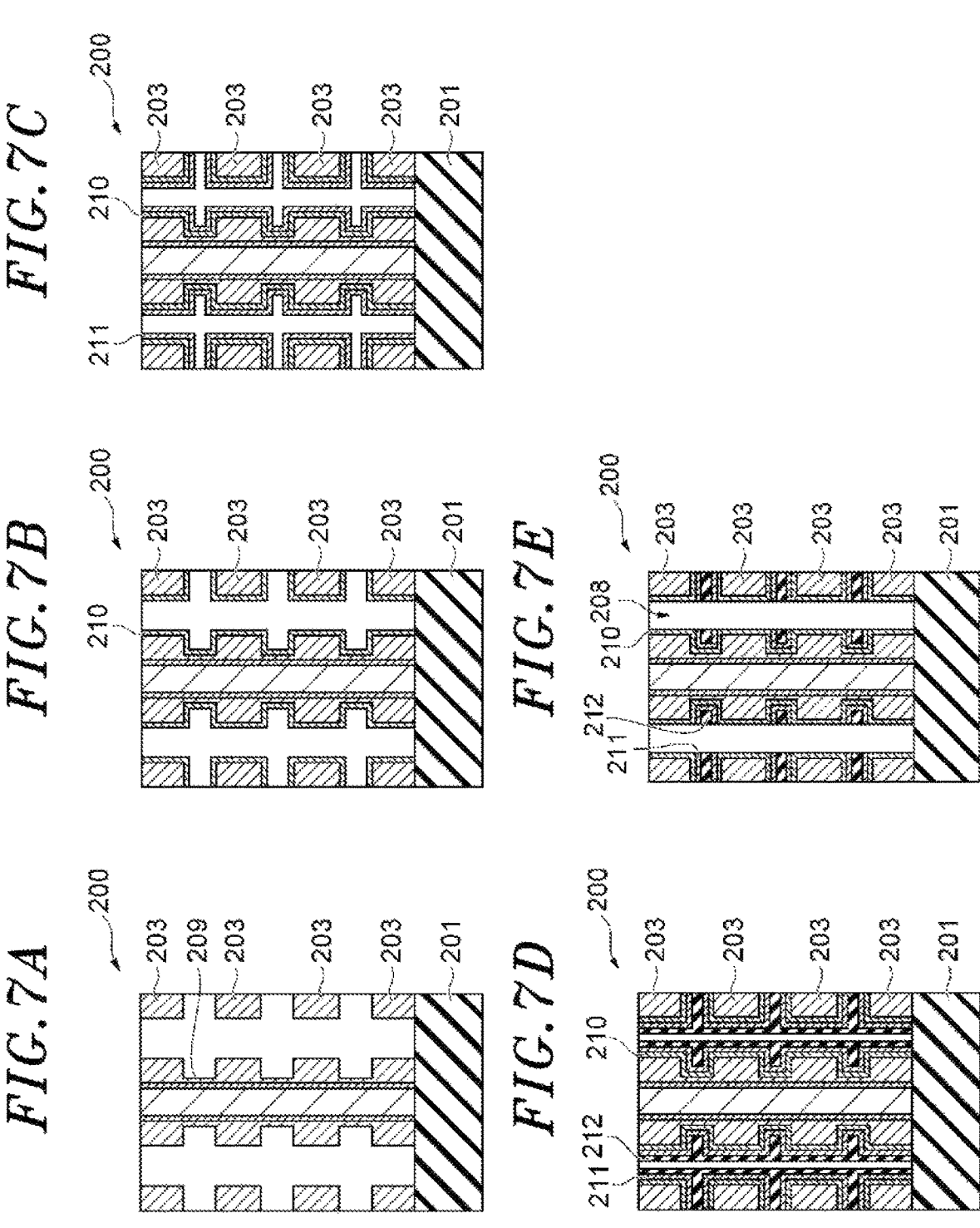

*FIG.10*

PLASMA PROCESSING DEVICE AND PLASMA PROCESSING METHOD

TECHNICAL FIELD

Exemplary embodiments of the present disclosure relate to a plasma processing device and a plasma processing method.

BACKGROUND

Plasma processing is performed as an example of substrate processing. In the plasma processing, a substrate is processed by chemical species from plasma generated in a chamber. The chemical species in the plasma include ions and radicals. Since ions can damage the substrate, substrate processing may be performed using radicals. Patent Document 1 below discloses a plasma processing device which enables the substrate processing using the radicals.

PRIOR ART DOCUMENTS

Patent Documents

Patent Document 1: Specification of US Patent No. 8207470

SUMMARY

Problems to Be Resolved by the Invention

The present disclosure provides a technique for switchably using remote plasma and direct plasma.

Means for Solving the Problem

In one exemplary embodiment, a plasma processing device is provided. The plasma processing device includes a chamber; an upper electrode; a showerhead; a substrate support portion; an ion trap; a first gas supply portion; a second gas supply portion; a power source; and a switch. The substrate support portion is configured to support a substrate in the chamber. The showerhead is provided below the upper electrode. The shower head divides an internal space of the chamber into a first space between the upper electrode and the showerhead and a second space below the showerhead. The showerhead provides a plurality of introduction ports for introducing a gas into the second space and a plurality of openings penetrating the showerhead so that the first space and the second space are in communication with each other. The substrate support portion is configured to support a substrate in the second space. The ion trap is provided between the upper electrode and the showerhead. The ion trap provides a plurality of through holes arranged not to align with the plurality of openings of the showerhead. The first gas supply portion is configured to supply a gas to an area in the first space between the upper electrode and the ion trap. The second gas supply portion is configured to supply a gas, to be introduced into the second space from the plurality of introduction ports, to the showerhead. The power source is configured to produce power for generating plasma, and is connected to the upper electrode. The switch is configured to switchably connect the showerhead to one of a ground and the upper electrode.

Effect of the Invention

According to one exemplary embodiment, it is possible to switchably use remote plasma and direct plasma.

BRIEF DESCRIPTION OF THE DRAWINGS

FIGS. 5A to 5D are partially enlarged cross-sectional views of a substrate of one example for describing a plasma processing method according to one exemplary embodiment.

FIGS. 7A to 7E are partially enlarged cross-sectional views of a substrate of one example for describing a plasma processing method according to another exemplary embodiment.

FIG. 10 is a diagram illustrating an upper electrode according to another exemplary embodiment.

Each of FIGS. 11A to 11D is a plan view illustrating one or more cavities in the upper electrode according to another exemplary embodiment.

Figure 12:
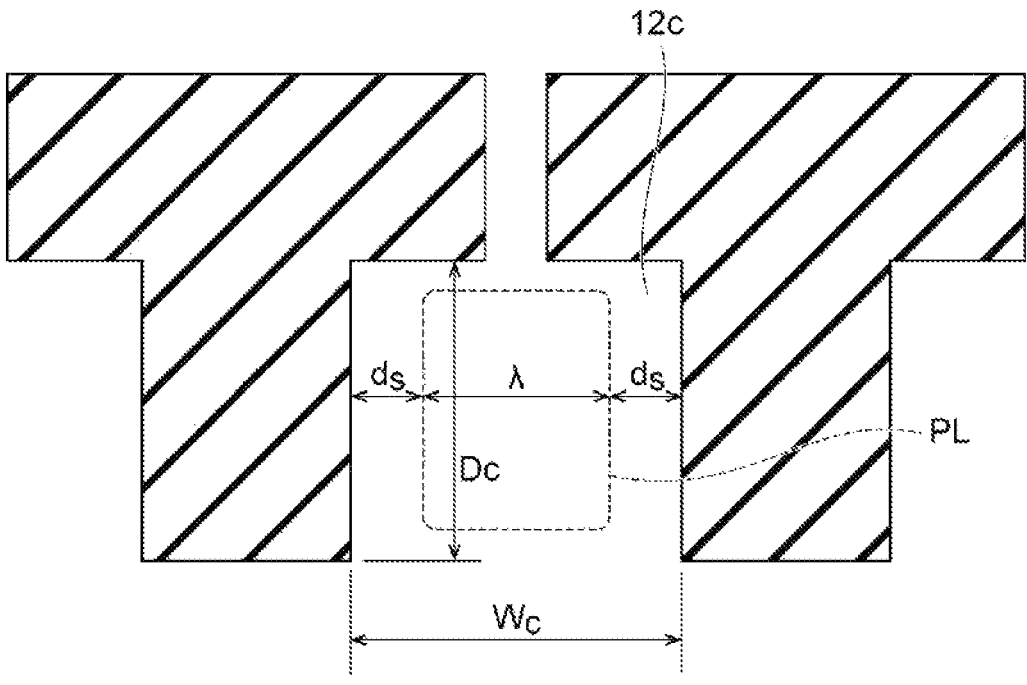

FIG. 12 is an enlarged cross-sectional view of one or more cavities in the upper electrode according to another exemplary embodiment.

DETAILED DESCRIPTION

Hereinafter, various exemplary embodiments will be described.

In one exemplary embodiment, a plasma processing device is provided. The plasma processing device includes a chamber; an upper electrode; a showerhead; a substrate support portion; an ion trap; a first gas supply portion; a second gas supply portion; a power source; and a switch. The showerhead is provided below the upper electrode. The shower head divides an internal space of the chamber into a first space between the upper electrode and the showerhead and a second space below the showerhead. The showerhead provides a plurality of introduction ports for introducing a gas into the second space and a plurality of openings penetrating the showerhead so that the first space and the second space are in communication with each other. The substrate support portion is configured to support a substrate in the second space. The ion trap is provided between the upper electrode and the showerhead. The ion trap provides a plurality of through holes arranged not to align with the plurality of openings of the showerhead. The first gas supply portion is configured to supply a gas to a region in the first space between the upper electrode and the ion trap. The second gas supply portion is configured to supply the showerhead with a gas to be introduced into the second space from the plurality of introduction ports. The power source is configured to produce power for generating plasma, and is connected to the upper electrode. The switch is configured to switchably connect the showerhead to one of a ground and the upper electrode.

In the plasma processing device of the embodiment, the plurality of through holes of the ion trap are arranged not to align with the plurality of openings of the showerhead. Therefore, most or all of ions in the plasma generated in the region in the first space are trapped by the ion trap, and not substantially supplied to the second space. Meanwhile, radicals in the plasma generated in the region in the first space are supplied to the second space. Therefore, plasma processing by remote plasma becomes possible with respect to the substrate disposed in the second space. Further, when the showerhead is connected to the upper electrode by the switch, generation of the plasma is not hindered by the ion trap, and the plasma is generated in the second space. Therefore, plasma processing by direct plasma becomes possible with respect to the substrate disposed in the second space.

In one exemplary embodiment, the plasma processing device may further include a controller. The controller may control the switch so as to connect the showerhead to the ground, control the first gas supply portion so as to supply the processing gas to the region in the first space, and control the power source so as to supply the power to the upper electrode. By such a control, the plasma is generated in the first space, and the radicals are supplied from the generated plasma to the second space. The controller may control the switch so as to connect the showerhead to the upper electrode, control the second gas supply portion so as to introduce the processing gas into the second space through the plurality of introduction ports of the showerhead, and control the power source so as to supply the power to the upper electrode. By such a control, generation of the plasma is not hindered by the ion trap, and the plasma is generated in the second space.

Even in another exemplary embodiment, a plasma processing device is provided. The plasma processing device includes a chamber; an upper electrode; a showerhead; a substrate support portion; an ion trap; a first gas supply portion; a second gas supply portion; a first power source; and a second power source. The showerhead is provided below the upper electrode. The shower head divides an internal space of the chamber into a first space between the upper electrode and the showerhead and a second space below the showerhead. The showerhead provides a plurality of introduction ports for introducing a gas into the second space and a plurality of openings penetrating the showerhead so that the first space and the second space are in communication with each other. The showerhead is grounded. The substrate support portion includes an electrode, and is configured to support the substrate in the second space. The ion trap is provided between the upper electrode and the showerhead. The ion trap provides a plurality of through holes arranged not to align with the plurality of openings of the showerhead. The first gas supply portion is configured to supply a gas to a region in the first space between the upper electrode and the ion trap. The second gas supply portion is configured to supply the showerhead with a gas to be introduced into the second space from the plurality of introduction ports. The first power source is configured to produce a first power for generating plasma, and is connected to the upper electrode. The second power source is configured to generate a second power for generating the plasma, and is connected to the electrode of the substrate support portion.

Even in the plasma processing device of the embodiment, plasma processing by remote plasma becomes possible with respect to the substrate disposed in the second space. Further, in the second space, generation of the plasma is not hindered by the ion trap, and the plasma is generated. Therefore, plasma processing by direct plasma becomes possible with respect to the substrate disposed in the second space.

In one exemplary embodiment, the plasma processing device may further include a controller. The controller may control the first gas supply portion so as to supply the processing gas to the region in the first space, and control the first power source so as to supply the first power to the upper electrode. By such a control, the plasma is generated in the first space, and the radicals are supplied from the generated plasma to the second space. The controller may control the second gas supply portion so as to introduce the processing gas into the second space through the plurality of introduction ports of the showerhead, and control the second power source so as to supply the second power to the electrode of the substrate support portion. By such a control, generation of the plasma is not hindered by the ion trap, and the plasma is generated in the second space.

In one exemplary embodiment, the first space may include one or more cavities provided by the upper electrode. The plasma may be generated in the first space by hollow cathode discharge in one or more cavities.

In one exemplary embodiment, the upper electrode may provide one or more grooves opened downward as one or more cavities. Each of one or more grooves has a ring shape, and extends around a central axial line extending in a vertical direction. The upper electrode may provide a plurality of first grooves and a plurality of second grooves opened downward as the one or more cavities. Each of the plurality of first grooves extends in one direction. Each of the plurality of second grooves are extended in different directions to cross the plurality of first grooves.

In one exemplary embodiment, the upper electrode may provide a plurality of holes opened downward as one or more cavities. The plurality of holes are arranged in a circumferential direction around the central axis line extending in the vertical direction or in a grid shape.

In one exemplary embodiment, the ion trap may be made of a conductive material, and may be electrically connected to the showerhead.

In one exemplary embodiment, the ion trap may be made of a dielectric.

In one exemplary embodiment, the plasma processing device may further include a conductive member. The conductive member is extended on a lateral side of the region in the first space, and is electrically connected to the showerhead.

In another exemplary embodiment, a plasma processing method is provided. In the plasma processing method, a plasma processing device of any one of various exemplary embodiments is used. The plasma processing method includes a process of preparing the substrate on the substrate support portion in the second space. The plasma processing method further includes a process of processing the substrate in the second space by radicals. The radicals are supplied to the second space from the plasma generated in the region in the first space through the plurality of through holes of the ion trap and the plurality of openings of the showerhead. The plasma processing method includes a process of processing the substrate in the second space by chemical species. The chemical species are supplied to the substrate from the plasma generated in the second space.

In one exemplary embodiment, the radicals may be used in a film forming. The chemical species may be used in an anisotropic etching.

In one exemplary embodiment, the radicals may be used in an etching. The chemical species may be used in an anisotropic etching.

In one exemplary embodiment, the plasma processing method may further include a process of processing the substrate in the second space by other radicals. The other radicals may be supplied to the second space from the plasma generated in the region in the first space through the plurality of through holes of the ion trap and the plurality of openings of the showerhead, and may be used in a film forming.

Hereinafter, various exemplary embodiments will be described in detail with reference to drawings. Further, in each drawing, the same or equivalent part will be denoted by the same reference numeral.

Figure 1:
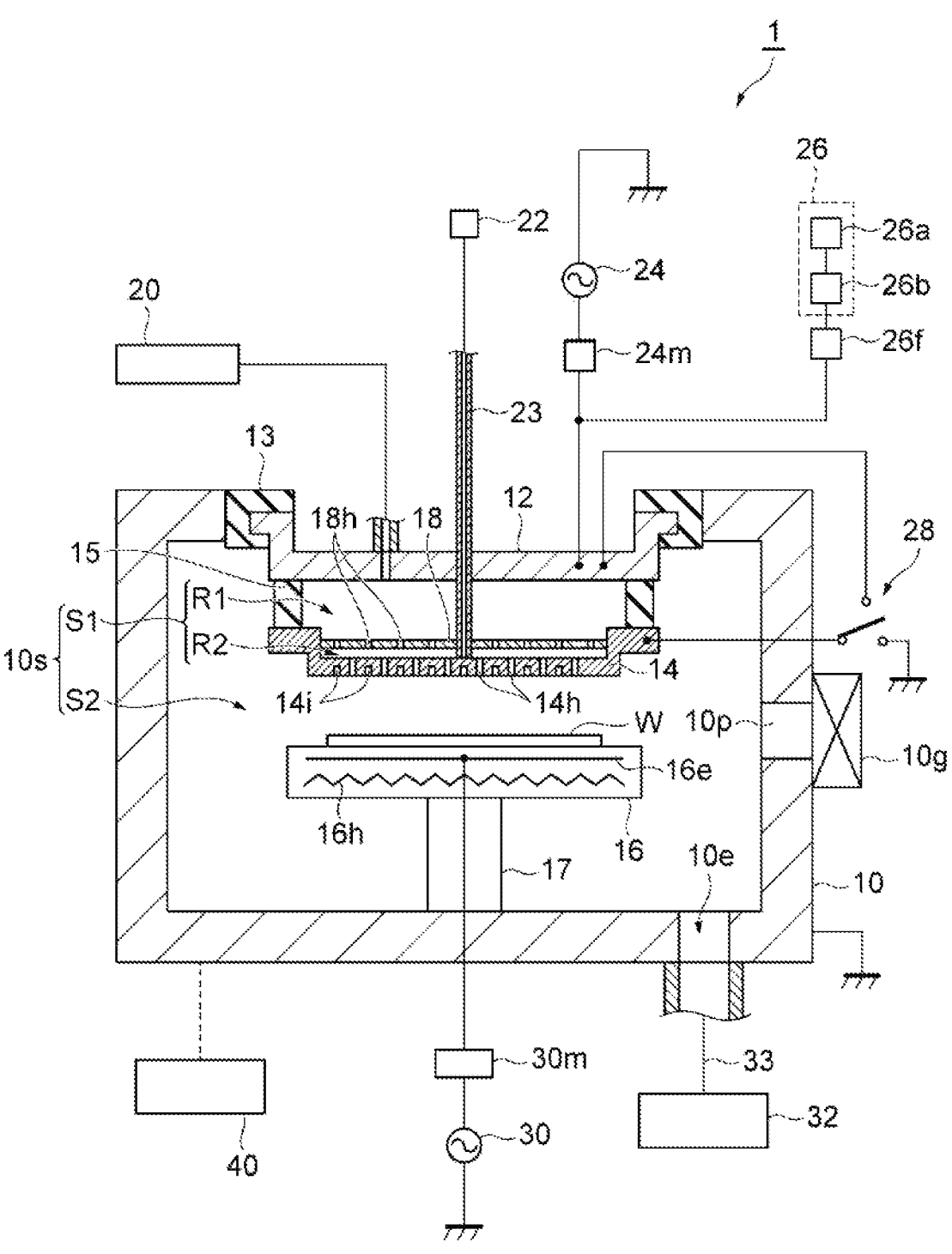
FIG. 1 is a diagram schematically illustrating a plasma processing device according to one exemplary embodiment.

FIG. 1 is a diagram schematically illustrating a plasma processing device according to one exemplary embodiment. The plasma processing device 1 illustrated in FIG. 1 includes a chamber 10. The chamber 10 has an approximately cylindrical shape. The chamber 10 is made of a conductive material such as aluminum. The chamber 10 may be grounded. The chamber 10 provides an internal space 10$s$ therein.

The plasma processing device 1 further includes an upper electrode 12. The upper electrode 12 is extended above a substrate support portion 16 described later. In one embodiment, the upper electrode 12 closes a top opening of the chamber jointly with a member 13. The upper electrode 12 has an approximately disk shape, and is made of the conductive material such as aluminum. The member 13 is made of an insulating material. The member 13 is interposed between a top of the chamber 10 and the upper electrode 12.

The plasma processing device 1 further includes a shower head 14. The shower head 14 is provided below the upper electrode 12. The shower head 14 has the approximately disk shape. The shower head 14 is made of the conductive material such as aluminum. The shower head 14 divides the internal space 10$s$ into a first space S1 and a second space S2. The first space S1 is a space between the upper electrode 12 and the shower head 14. The second space S2 is a space below the shower head 14.

In one embodiment, a member 15 may be provided between the upper electrode 12 and the shower head 14. The member 15 has the cylindrical shape, and is made of an insulating material such as conductor such as aluminum oxide. The first space S1 is a space between the upper electrode 12 and the shower head 14, and inside the member 15.

The shower head 14 provides a plurality of introduction ports 14$i$ and a plurality of openings 14$h$. The plurality of introduction ports 14$i$ is formed in the shower head 14 in order to introduce a gas into the second space S2. The plurality of openings 14$h$ is formed in the shower head 14 so as for the first space S1 and the second space S2 to be in communication with each other.

The chamber 10 has a side wall. The side wall of the chamber 10 provides a passage 10$p$. When the substrate W is transported between the second space S2 and the outside of the chamber 10, the substrate W passes through the passage 10$p$. The plasma processing device 1 may further includes a gate valve 10$g$. The gate valve 10$g$ is provided along the side wall of the chamber 10 in order to open/close the passage 10$p$.

The plasma processing device 1 further includes the substrate support portion 16. The substrate support portion 16 is configured to support the substrate W in the second space S2. The substrate W may have the approximately disk shape. The substrate W is processed in a state of being mounted on the substrate support portion 16 in the second space S2. The substrate support portion 16 may be made of insulating ceramics such as aluminum nitride. Alternatively, the substrate support portion 16 may be made of the conductive material.

In one embodiment, the substrate support portion 16 may be supported by a support member 17. The support member 17 may be extended upward from the bottom of the chamber 10. The substrate support portion 16 may have a heater 16$h$. The heater 16$h$ is provided inside the substrate support portion 16. The heater 16$h$ is configured to receive a power supplied from a heater power source. The heater 16$h$ is configured to heat the substrate W on the substrate support portion 16 at a predetermined temperature.

In one embodiment, the substrate support portion 16 may further include an electrode 16$e$. The electrode 163 is provided inside the substrate support portion 16. Further, when the substrate support portion 16 is made of the conductive material, the substrate support portion 16 serves as the electrode 16$e$.

The plasma processing device 1 further includes an ion trap 18. The ion trap 18 is provided between the upper electrode 12 and the shower head 14. In one embodiment, the ion trap 18 may be made of the conductive material such as aluminum. The ion trap has the approximately disk shape. The ion trap 18 divides the first space S1 into a region R1 and a region R2. The region R1 is a region between the upper electrode 12 and the ion trap 18, and the region R2 is a region between the ion trap 18 and the shower head 14.

The ion trap 18 provides a plurality of through holes 18$h$. The plurality of through holes 18$h$ are arranged not to align with the plurality of openings 14$h$, respectively. That is, the bottoms of the plurality of through holes 18$h$ are arranged not to face the tops of the plurality of openings 14$h$, respectively. In other words, the plurality of through holes 18$h$ and the plurality of openings 14$h$ are arranged so that figures acquired by projecting the through holes and the openings on a plane parallel to the substrate W do not overlap with each other. The ion trap 18 captures ions from plasma generated inside the region R1 in the first space S1, and prevents invasion of the ions into the second space S2 from the region R1. Meanwhile, the ion trap 18 permits radicals from the plasma generated inside the region R1 in the first space S1 to pass through the second space S2.

In one embodiment, an inner wall surface of the chamber 10, a surface of the upper electrode 12, a surface of the shower head 14, and a surface of the ion trap 18 may be covered with a member having corrosion resistance. The member may be an alumite film or an oxide yttrium film.

The plasma processing device 1 further includes the first gas supply portion 20. The first gas supply portion 20 is configured to supply a gas to the region R1. In one embodiment, the first gas supply portion 20 is connected to the gas introduction ports of the upper electrode 12, and supplies the gas to the region R1 through the gas introduction ports.

The plasma processing device 1 further includes the second gas supply portion 22. The second gas supply portion 22 is configured to supply the gas to the shower head 14. In one embodiment, the second gas supply portion 22 is connected to the shower head 14 through a pipe 23, and supplies the gas to the shower head 14 through the pipe 23. The gas supplied to the shower head 14 from the second gas supply portion 22 is introduced into the second space S2 from the plurality of introduction ports 14i which are in communication with each other in the shower head 14.

The plasma processing device 1 includes one or more power sources in order to produce the plasma from the gas inside the chamber 10. One or more power sources are connected to the upper electrode 12. In one embodiment, the plasma processing device 1 may include a high-frequency power source 24 and a DC pulse power source 26, as one or more power sources.

The high-frequency power source 24 generates high-frequency power (hereinafter, may be referred to as "first high-frequency power") used for generating the plasma. The high-frequency power source 24 is connected to the upper electrode 12. The first high-frequency power is supplied to the upper electrode 12. A frequency of the first high-frequency power may be 300 kHz or more and 100 MHz or less. In one example, the frequency of the first high-frequency power may be 40 MHz.

The high-frequency power source 24 may be connected to the upper electrode 12 through a matcher 24m. The matcher 24m includes a matching circuit for matching a load-side impedance of the high-frequency power source 24 with an output impedance of the high-frequency power source 24.

The DC pulse power source 26 intermittently or periodically generates a pulse-shaped DC voltage. The DC pulse power source 26 is connected to the upper electrode 12. The pulse-shaped DC voltage generated by the DC pulse power source 26 is applied to the upper electrode 12. The pulse-shaped DC voltage may have a positive polarity or a negative polarity. A frequency for determining a period of the pulse-shaped DC voltage applied to the upper electrode 12 is 10 Hz or more and 1 MHz or less. The frequency is a reverse number of the period of the pulse-shaped DC voltage applied to the upper electrode 12. In one example, the frequency may be 500 kHz.

In one embodiment, the DC pulse power source 26 may include a DC power source 26a and a pulse unit 26b. The DC power source 26a is a poser source that generates the DC voltage. The DC power source 26a is a variable DC power source. The pulse unit 26b is connected between the DC power source 26a and the upper electrode 12. The pulse unit 26b is configured to modulate the DC voltage from the DC power source 26a to the pulse-shaped DC voltage. The pulse unit 26b may be constituted by one or more switching transistors.

In one embodiment, the DC pulse power source 26 may be connected to the upper electrode 12 through a filter 26f. The filter 26f is an electric filter that blocks or attenuates the high-frequency power.

The plasma processing device 1 further includes a switch 28. The switch is configured to switchably connect the shower head 14 to one of a ground and the upper electrode 12.

In one embodiment, the plasma processing device 1 may further include a high-frequency power source 30. The high-frequency power source 30 is a power source that generates high-frequency power (hereinafter, may be referred to as "second high-frequency power"). The high-frequency power source 30 is connected to the electrode 16e. The second high-frequency power is supplied to the electrode 16e. The frequency of the second high-frequency power is 300 kHz or more and 100 MHz or less. In one example, the frequency of the second high-frequency power may be 400 kHz.

The high-frequency power source 30 may be connected to the electrode 16e through a matcher 30m. The matcher 30m includes a matching circuit for matching a load-side impedance of the high-frequency power source 30 with an output impedance of the high-frequency power source 30.

In one embodiment, the plasma processing device 1 may further include an exhaust device 32. The exhaust device 32 is connected to the internal space 10s of the chamber 10 through an exhaust pipe 33. The exhaust device 32 may include one or more pumps such as a dry pump and a turbo molecular pump, and a pressure controller such as an automatic pressure control valve. In one embodiment, the exhaust device 32 may be connected to the second space S2 through the exhaust pipe 33 and an exhaust port 10e. The exhaust port 10e may be provided on the bottom of the chamber 10.

In one embodiment, the plasma processing device 1 may further include a controller 40. The controller 40 is configured to control each portion of the plasma processing device 1. The controller 40 may be a computer having a processor, an input device, an output device, a display device, and a storage device. The storage device stores a control program and recipe data. The processor executes the control program, and controls each portion of the plasma processing device 1 according to the recipe data. As a result, in the plasma processing device 1, plasma processing according to the recipe data is executed. A plasma processing method according to various exemplary embodiments described later may be executed in the plasma processing device 1 by controlling each portion of the plasma processing device 1 by the controller 40.

Figure 2:
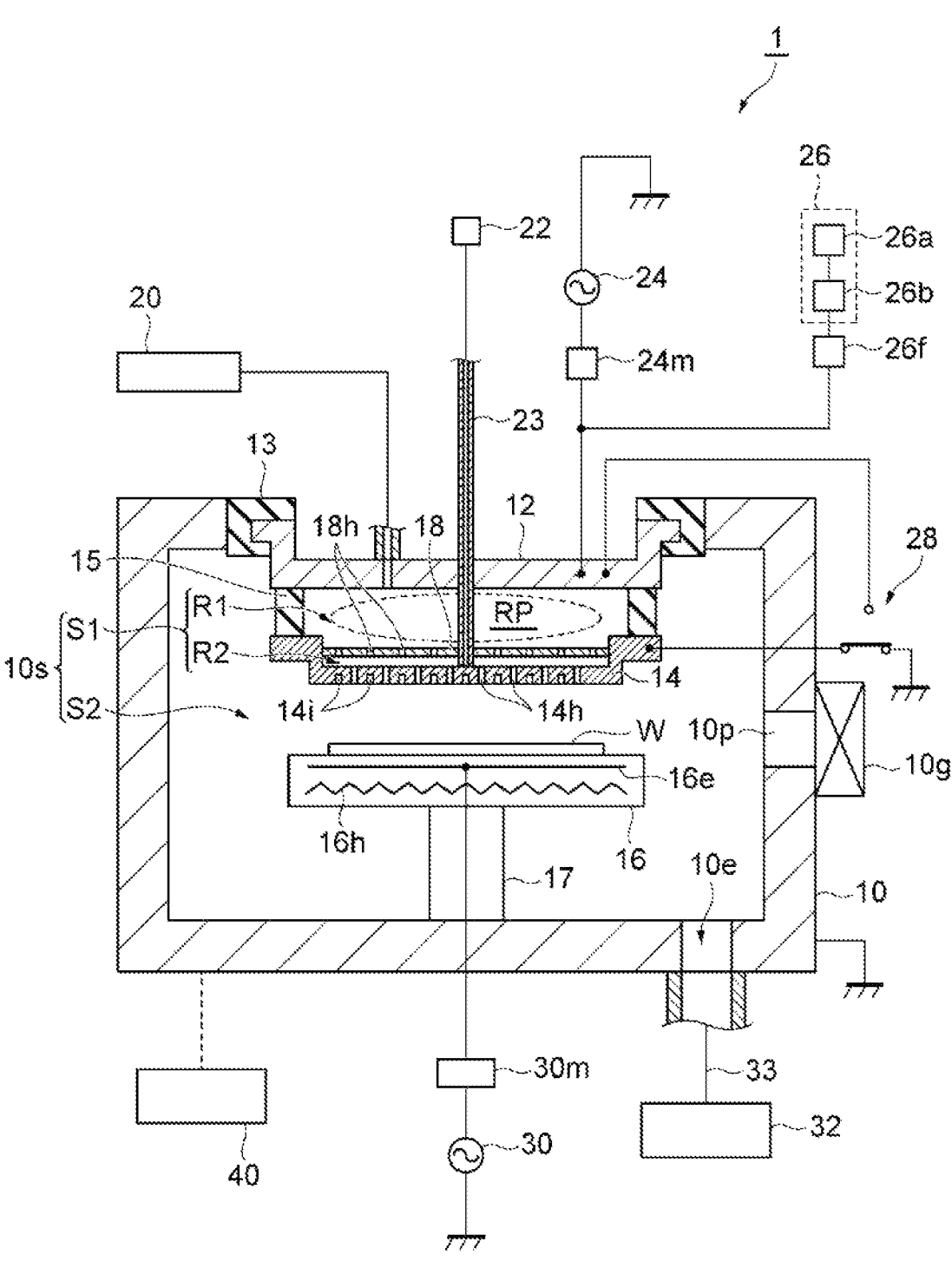
FIG. 2 is a diagram illustrating remote plasma generated in a plasma processing device according to an exemplary embodiment.

FIG. 2 is a diagram illustrating remote plasma generated in a plasma processing device according to one exemplary embodiment. In the plasma processing device 1, when the substrate W is processed by using radicals supplied to the second space S2 from plasma (remote plasma RP) generated in the region R1, the switch 28 connects the shower head 14 to the ground. Further, the gas from the first gas supply portion 20 is supplied to the region R1. Further, the exhaust device 32 reduces a pressure inside the internal space 10s to a specified pressure. In addition, one or both of the first high-frequency power and the pulse-shaped DC voltage are given to the upper electrode 12. To this end, the controller 40 may control the switch 28, the first gas supply portion 20, the high-frequency power source 24, the DC pulse power source 26, and the exhaust device 32. A high-frequency electric field is formed inside the region R1, i.e., between the upper electrode 12 and the shower head 14. In the region R1, the gas is excited by the high-frequency electric field and the plasma is generated. The substrate W mounted on the substrate support portion 16 in the second space S2 is processed in the second space S2 by the radicals from plasma generated in the region R1, i.e., the remote plasma RP.

Figure 3:
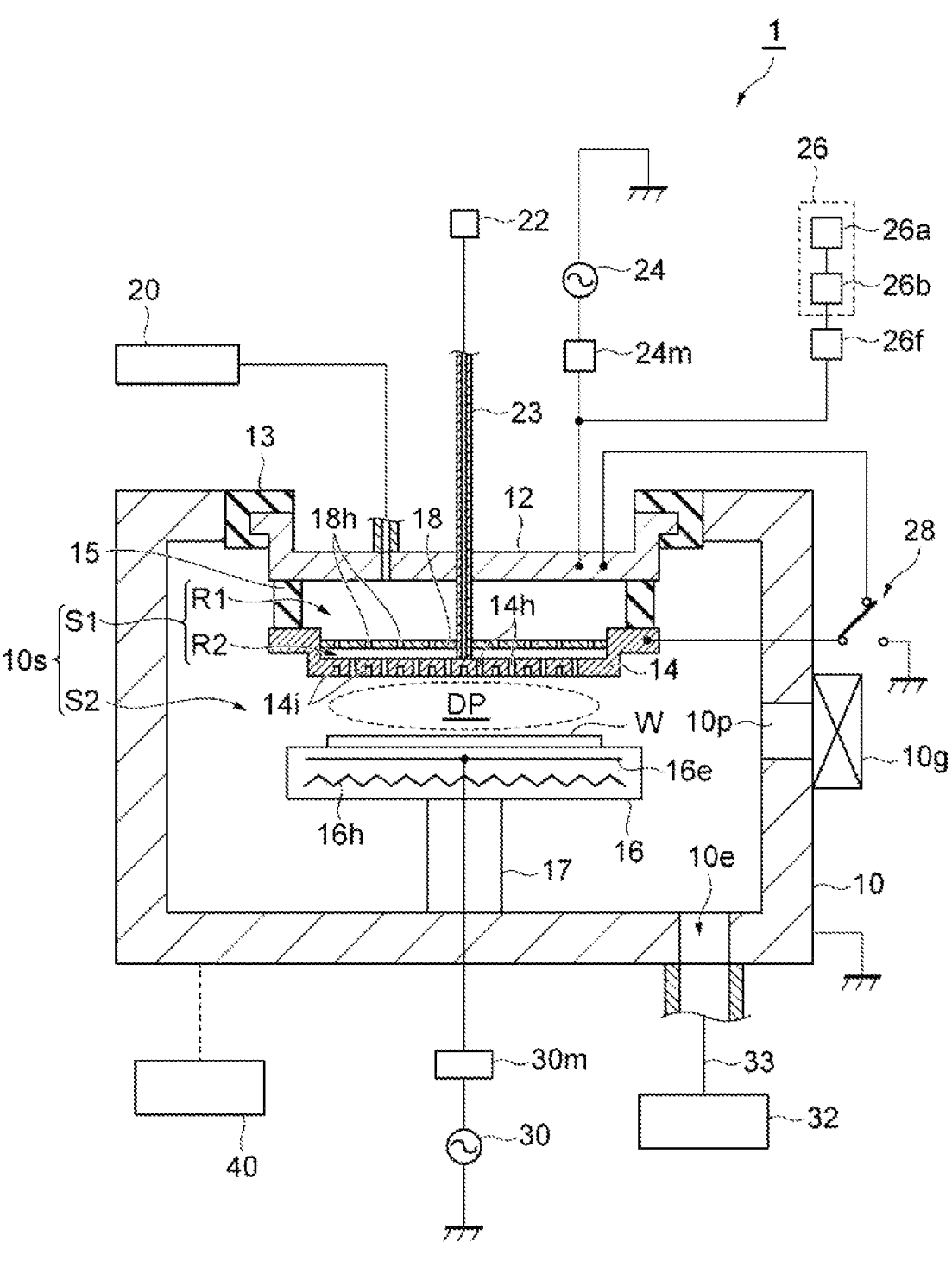
FIG. 3 is a diagram illustrating direct plasma generated in a plasma processing device according to an exemplary embodiment.

FIG. 3 is a diagram illustrating direct plasma generated in a plasma processing device according to one exemplary embodiment. In the plasma processing device 1, when the substrate W is processed by using chemical species from plasma (direct plasma DP) generated in the second space S2, the switch 28 connects the shower head 14 to not the ground but the upper electrode 12. Further, the gas from the second gas supply portion 22 is supplied to the second space S2 from the shower head 14. Further, the exhaust device 32 reduces a pressure inside the internal space 10s to a specified pressure. In addition, one or both of the first high-frequency power and the pulse-shaped DC voltage are supplied to the shower head 14 through the upper electrode 12. Further, the second high-frequency power may be supplied to the electrode 16e. To this end, the controller 40 may control the switch 28, the second gas supply portion 22, the high-frequency power source 24, the DC pulse power source 26, the exhaust device 32, and the high-frequency power source 30. The high-frequency electric field is formed inside the second space S2, i.e., in a space between the shower head 14 and the electrode 16e. In the second space S2, the gas is excited by the high-frequency electric field and the plasma is generated. The substrate W mounted on the substrate support portion 16 in the second space S2 is processed in the second space S2 by the chemical species from the plasma generated in the second space S2, i.e., the direct plasma DP.

In the plasma processing device 1, the plurality of through holes 18h of the ion trap 18 are arranged not to be align with the plurality of openings 14h of the shower head 14. Therefore, most or all of ions in the plasma generated in the region R1 in the first space S1 are captured by the ion trap 18, and not substantially supplied to the second space S2. Meanwhile, radicals in the plasma generated in the region R1 in the first space S1 are supplied to the second space. Therefore, according to the plasma processing device 1, plasma processing by the remote plasma RP for the substrate disposed in the second space S2 becomes possible. Further, when the shower head 14 is connected to the upper electrode 12 by the switch 28, generation of the plasma is not hindered by the ion trap, and the plasma is generated in the second space S2. Therefore, according to the plasma processing device 1, plasma processing by the direct plasma DP for the substrate W disposed in the second space S2 becomes possible.

Further, the ion trap 18 is not interposed between the shower head 14 and the electrode 16e. Therefore, when the direct plasma DP is generated, the ion trap 18 does not influence the high-frequency electric field formed between the shower head 14 and the electrode 16e. Further, when processing by the remote plasma RP and processing by the direct plasma DP are consecutively performed in the same chamber, a high throughput is obtained and an influence on a process by a change in environment around the substrate W is suppressed.

Figure 4:
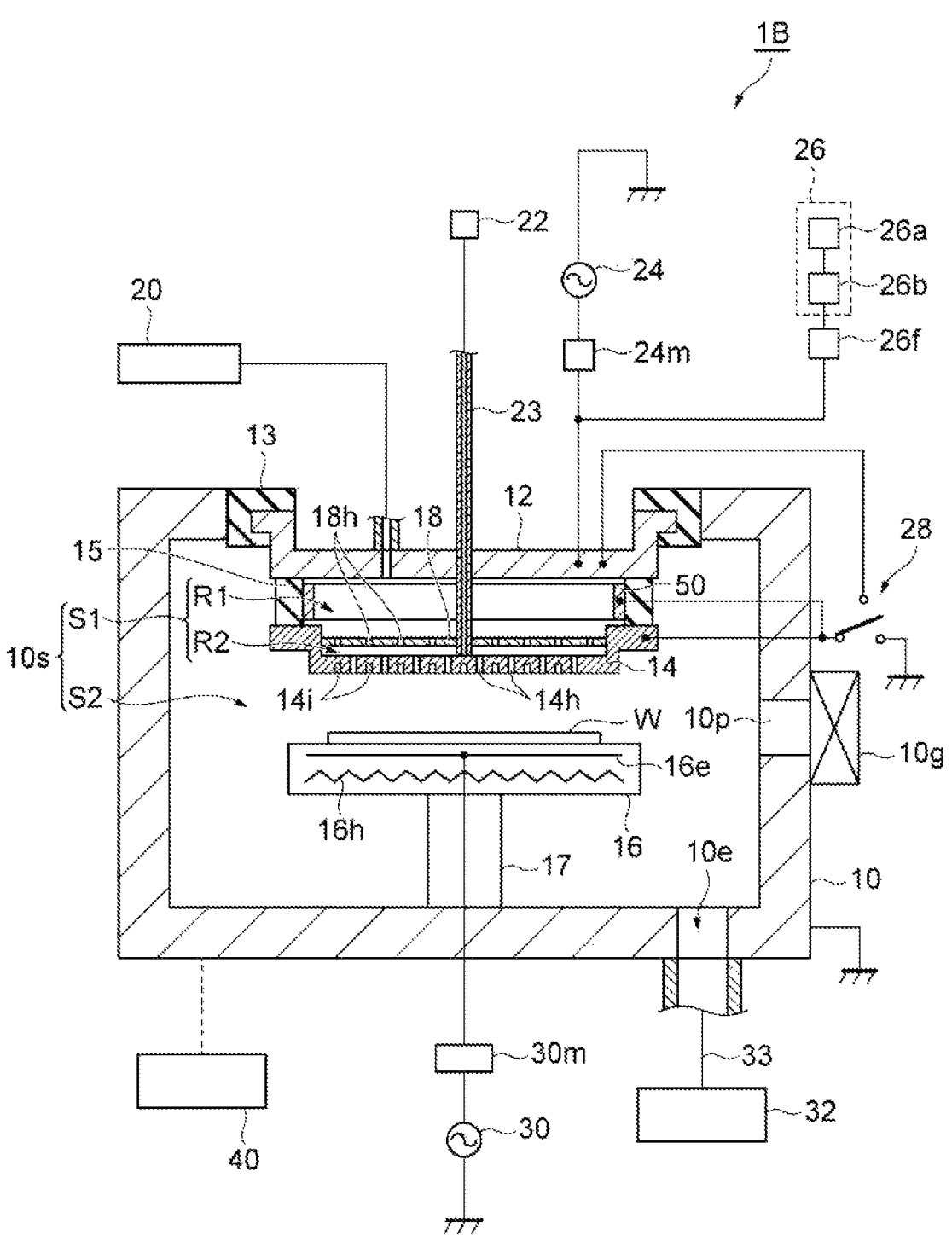
FIG. 4 is a diagram schematically illustrating a plasma processing device according to another exemplary embodiment.

Hereinafter, a plasma processing device according to another exemplary embodiment will be described with reference to FIG. 4. FIG. 4 is a diagram schematically illustrating a plasma processing device according to another exemplary embodiment. In the following description, a difference of the plasma processing device 1B illustrated in FIG. 4 from the plasma processing device 1 will be described.

In the plasma processing device 1B, the ion trap 18 is made of a dielectric such as quartz or aluminum oxide other than the conductive material. The plasma processing device 1B may further include a conductive member 50. The conductive member 50 is extended on the side of the region R1 in the first space S1. The conductive member 50 may have, for example, the cylindrical shape. The conductive member 50 may be extended along an inner peripheral surface of the member 15. The conductive member 50 is electrically connected to the shower head 14.

According to the plasma processing device 1B, the plasma processing by the radicals from the remote plasma RP for the substrate disposed in the second space S2 becomes possible like the plasma processing device 1. Further, according to the plasma processing device 1B, the plasma processing by the chemical species from the direct plasma DP for the substrate W disposed in the second space S2 becomes possible like the plasma processing device 1.

Hereinafter, a plasma processing method according to various exemplary embodiments will be described. In various exemplary embodiments, the plasma processing method may be executed by using the plasma processing device 1 or the plasma processing device 1B. In various exemplary embodiments, the plasma processing method includes a process of preparing a substrate. The plasma processing method further includes at least one of a remote plasma processing process and a direct plasma processing process.

In the substrate preparation process, the substrate W is mounted on the substrate support portion 16 in the second space S2. The remote plasma processing process and the direct plasma processing process are performed in the state in which the substrate W is mounted on the substrate support portion 16.

In the remote plasma processing process, the substrate W is processed by the radicals in the second space S2. The radicals are supplied to the second space S2 from the plasma generated in the region R1 in the first space S1, i.e., the remote plasma RP through the plurality of through holes 18h of the ion trap 18 and the plurality of openings 14h of the shower head 14. The radicals from the remote plasma RP may be used in a film forming for the substrate W. Alternatively, the radicals from the remote plasma RP may be used in an etching for the substrate W. The etching by the radicals from the remote plasma RP may be an isotropic etching.

In the direct plasma processing process, the substrate W is processed by the chemical specifies in the second space S2. The chemical specifies are supplied to the substrate W from the plasma generated in the second space S2, i.e., the direct plasma DP. The chemical species from the direct plasma DP may be used in the anisotropic etching for the substrate W. Alternatively, the chemical species from the direct plasma DP may be used in the film forming for the substrate W.

In one embodiment, the plasma processing method may further include another remote plasma processing process. In another remote plasma processing process, the substrate W is processed by the radicals in the second space S2 like the remote plasma processing process. The radicals are supplied to the second space S2 from the plasma generated in the region R1 in the first space S1, i.e., the remote plasma RP through the plurality of through holes 18h of the ion trap 18 and the plurality of openings 14h of the shower head 14. In another remote plasma processing process, the radicals from the remote plasma RP may be used in a film forming for the substrate W. Another remote plasma processing process may be performed after the anisotropic etching for the substrate W in the direct plasma processing process and the isotropic etching for the substrate W in the remote plasma processing process.

Hereinafter, first to fifth embodiments of the plasma processing method will be described.

In the first embodiment, the plasma processing method includes a remote plasma processing process and a direct plasma processing process. In the remote plasma processing process, the radicals from the remote plasma RP are used in a film forming for the substrate W in the second space S2. In the continued direct plasma processing process, the chemical specifies from the direct plasma DP is used in an anisotropic etching for the substrate W in the second space S2.

In the second embodiment, the plasma processing method includes a remote plasma processing process and a direct plasma processing process. In the remote plasma processing process, the radicals from the remote plasma RP are used in an isotropic etching for the substrate W in the second space S2. In the continued direct plasma processing process, the chemical specifies from the direct plasma DP are used in an anisotropic etching for the substrate W in the second space S2.

In the third embodiment, the plasma processing method includes a direct plasma processing process and a remote plasma processing process. In the direct plasma processing process, the chemical specifies from the direct plasma DP are used in a film forming for the substrate W in the second space S2. In the continued remote plasma processing process, the radicals from the remote plasma RP are used in an isotropic etching for the substrate W in the second space S2.

In the fourth embodiment, the plasma processing method includes a remote plasma processing process and a direct plasma processing process. In the remote plasma processing process, the radicals from the remote plasma RP is used in a film forming for the substrate W in the second space S2. In the continued direct plasma processing process, the chemical specifies from the direct plasma DP are used in a film forming for the substrate W in the second space S2. The fourth embodiment may be executed for selective film forming on a specific region of the substrate W.

In the fifth embodiment, the plasma processing method includes a first remote plasma processing process and a second remote plasma processing process. In the first remote plasma processing process, the radicals from the remote plasma RP are used in an isotropic etching for the substrate W in the second space S2. In the continued second remote plasma processing process, radicals from another remote plasma RP are used in a film forming for the substrate W in the second space S2.

Hereinafter, an application example for several examples of the plasma processing method according to various exemplary embodiments will be described.

Figures 5A, 5B, 5C, 5D:
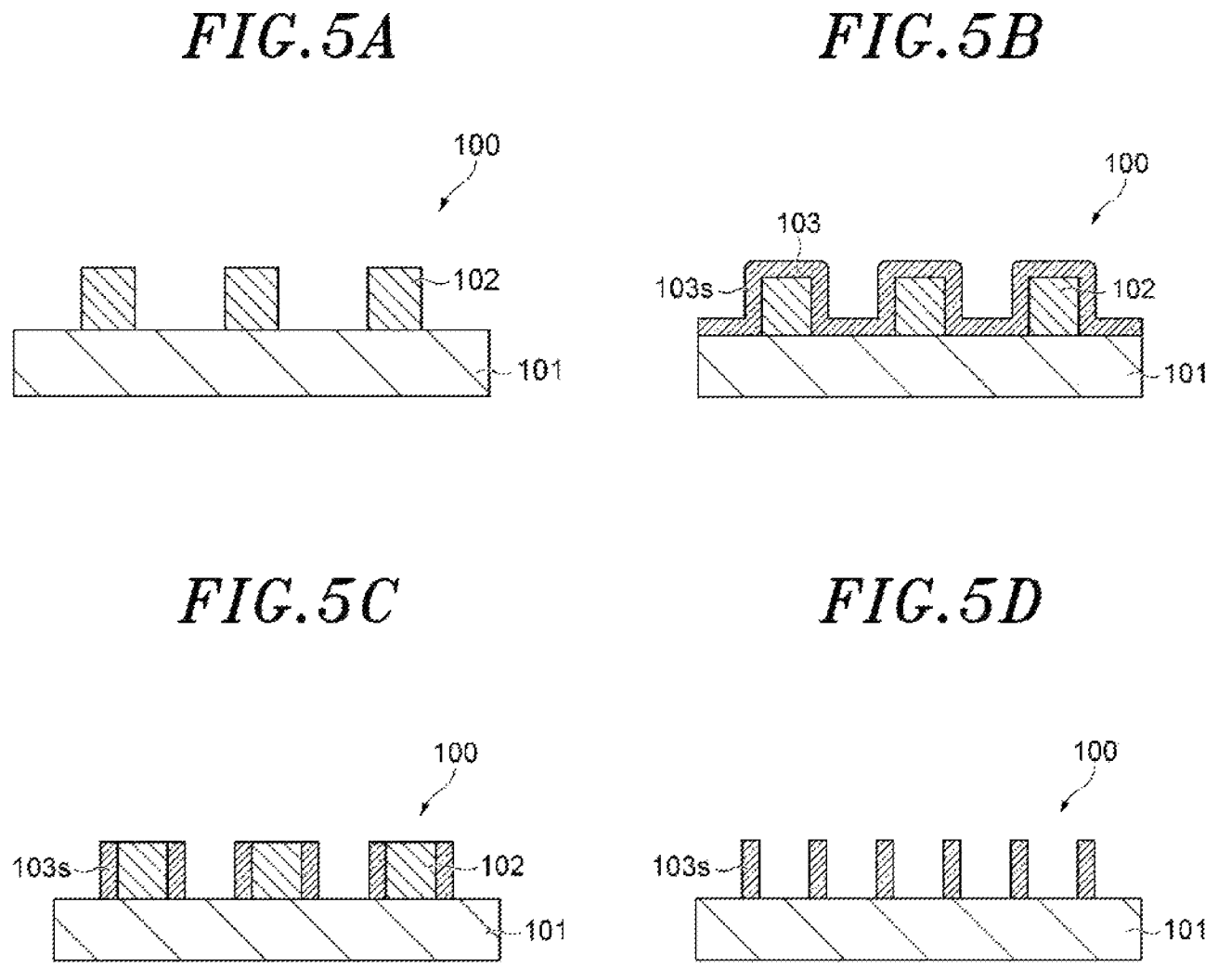

First, the application example is described with reference to FIGS. 5A to 5D. FIGS. 5A to 5D are partially enlarged cross-sectional views of a substrate of one example for describing a plasma processing method according to one exemplary embodiment. In one embodiment, the plasma processing method is applied to the substrate 100 illustrated in FIG. 5A. The plasma processing method applied to the substrate 100 illustrated in FIG. 5A is based on the first embodiment.

The substrate 100 illustrated in FIG. 5A has a base region 101 and a mask 102. The mask 102 is provided on the base region 101. The mask 102 is a photoresist mask or a mask formed by an organic film. The mask 102 is patterned to partially expose an upper surface of the base region 101. The base region 101 includes a film to be etched. The film may be a silicon contained film. When the mask 102 is a photoresist mask, the silicon contained film of the base region 101 includes an anti-reflective film. When the mask 102 is the mask formed by an organic film, the silicon contained film of the base region 101 includes a silicon nitride film or a silicon oxide film.

In the substrate preparation process of the plasma processing method, the substrate 100 is prepared on the substrate support portion 16 as the substrate W. Processes described below in the plasma processing method are executed in a state in which the substrate 100 is mounted on the substrate support portion 16.

The plasma processing method includes a film forming process and an etching process. The film forming process includes a precursor gas supply process and a remote plasma processing process. In the precursor gas supply process, a precursor gas is supplied to the substrate 100. The precursor gas is a gas including a precursor. The precursor contains silicon. The precursor includes, for example, aminosilane. The aminosilane is, for example, bistertbutylaminosilane (BTBAS). The aminosilane may be bisdiethylaminosilane (BDEAS), bismethylaminosilane (BDMAS), di-isopropy-lamino silane (DIPAS), or bisethylaminosilane (BEMAS). In the precursor gas supply process, the precursor in the precursor gas is adsorbed on the surface of the substrate 100.

In the remote plasma processing process, plasma, i.e., the remote plasma RP is generated in the region R1. The remote plasma RP is formed by a reforming gas. The reforming gas is an oxygen contained gas or a nitrogen contained gas. In this process, oxygen radicals or nitrogen radicals from the remote plasma RP are supplied to the second space S2 and oxidize or nitrate the precursor. As a result, a spacer film 103 is formed on the surface of the substrate 100 as illustrated in FIG. 5B. The spacer film 103 is a silicon oxide film or a silicon nitride film.

Further, in the film formation process, the precursor gas supply process and the remote plasma processing process may be repeated alternately. Further, the film forming process may include a purge process between the precursor gas supply process and the remote plasma processing process, and between the remote plasma processing process and the precursor gas supply process. In the purge process, a purge in the chamber 10 is performed.

The etching process is performed after the film forming process. The etching process is a type of direct plasma processing process. In the etching process, the spacer film 103 is etched by the chemical species from the plasma generated from the processing gas in the second space S2, i.e., the direct plasma DP. The processing gas used in the etching process for the spacer film 103 includes fluorocarbon gas and/or hydrofluorocarbon gas. The processing gas may contain another gas such as rare gas. In the etching process, the anisotropic etching of the spacer film 103 is performed. In the etching process, as illustrated in FIG. 5C, the spacer film 103 is etched so as to leave a region 103s which is a part of the spacer film 103 as illustrated in FIG. 5C. The region 103s is extended along a side surface of the mask 102. In the etching process, the second high-frequency power may be supplied to the electrode 16e in order to attract ions into the substrate 100.

The plasma processing method may further include a mask removal process. The mask removal process is a type of direct plasma processing process. In the mask removal process, the mask 102 is etched by the chemical species from the plasma generated from the processing gas in the second space S2, i.e., the direct plasma DP. The processing gas used in the mask removal process includes at least one of oxygen, nitrogen, hydrogen, and ammonia. In the mask removal process, the mask 102 is etched and removed as illustrated in FIG. 5D. As a result, the region 103s is left as a new mask on the base region 101. That is, in the plasma processing method, the mask is formed by double pattern-ing.

Figures 6A, 6B, 6C, 6D, 6E, 6F:
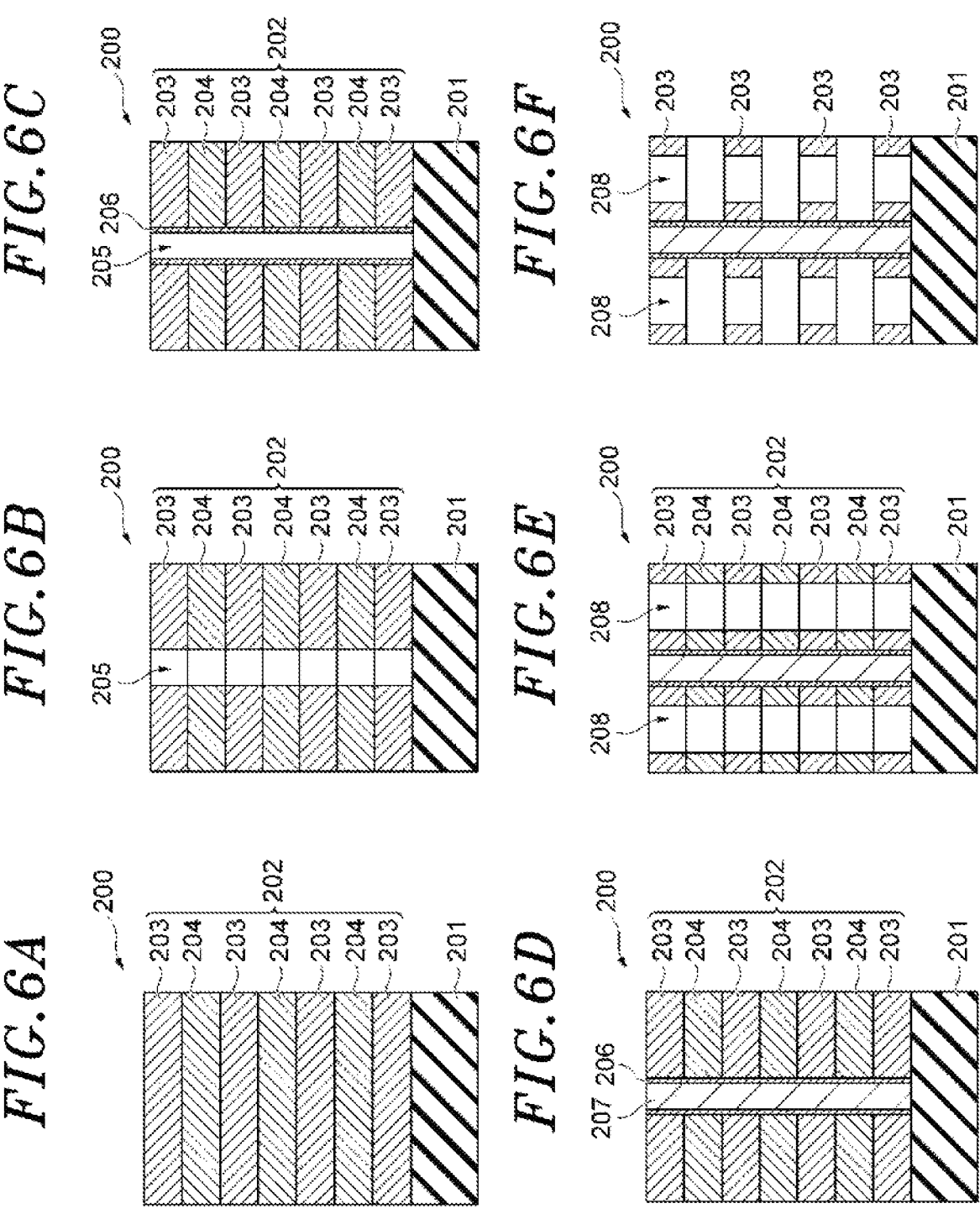
FIGS. 6A to 6F are partially enlarged cross-sectional views of a substrate of one example for describing a plasma processing method according to another exemplary embodiment.

Next, FIGS. 6A to 6F and FIGS. 7A to 7E are referenced. FIGS. 6A to 6F and FIGS. 7A to 7E are partially enlarged cross-sectional views of a substrate of one example for describing a plasma processing method according to another exemplary embodiment. In one embodiment, the plasma processing method is applied to the substrate 200 illustrated in FIG. 6A. The plasma processing method applied to the substrate 200 illustrated in FIG. 6A is based on the second and fifth embodiments. The plasma processing method may be executed in order to manufacture a 3D NAND device.

The substrate 200 illustrated in FIG. 6A has a base region 201 and a multilayer film 202. The base region 201 is made of, for example, silicon. The multilayer film 202 includes a plurality of first layers 203 and a plurality of second layers 204. The plurality of first layers 203 and the plurality of second layers 204 are stacked alternately on the base region 201. The plurality of first layers 203 is made of silicon oxide. The plurality of second layers 204 is made of silicon nitride. The substrate 200 may further have a mask provided on the multilayer film 202.

In the substrate preparation process of the plasma processing method, the substrate 200 is prepared on the substrate support portion 16 as the substrate W. Processes described below in the plasma processing method may be executed in a state in which the substrate 200 is mounted on the substrate support portion 16.

Next, in the plasma processing method, a first etching process is executed. The first etching process may be a type of direct plasma processing process. In the first etching process, the multilayer film 202 is etched by the chemical species the plasma generated from the processing gas in the second space S2, i.e., the direct plasma DP. Processing gas used in the first etching process is gas containing fluorine or hydrogen. For example, the processing gas contains fluorocarbon gas and hydrofluorocarbon gas. The processing gas may contain another gas such as rare gas. In the first etching process, the anisotropic etching of the multilayer film 202 is performed. In the first etching process, a hole 205 is formed in the multilayer film 202 as illustrated in FIG. 6B. The hole 205 may be a channel hole. In the first etching process, the second high-frequency power may be supplied to the electrode 16e in order to attract ions into the substrate 200. Further, the first etching process may be executed by using a plasma processing device different from the plasma processing device 1 and the plasma processing device 1B.

Next, in the plasma processing method, a first film forming process is executed. In the first film forming process, a film 206 is formed on a wall surface partitioning the hole 205 as illustrated in FIG. 6C. The film 206 is a polycrystalline silicon film. The film 206 may be formed by a CVD method or an ALD method. The plasma processing device 1 or the plasma processing device 1B may be used for forming the film 206. Alternatively, another film forming device may be used for forming the film 206.

Next, in the plasma processing method, a first embedding process is executed. In the first embedding process, the hole 205 is buried by the silicon oxide and a region 207 made of the silicon oxide is formed in the hole 205, as illustrated in FIG. 6D. The region 207 may be formed by the CVD method or the ALD method. The plasma processing device 1 or the plasma processing device 1B may be used for forming the region 207. Alternatively, another film forming device may be used for forming the region 207.

Next, in the plasma processing method, another mask is formed on the multilayer film 202. Another mask may have a multilayer structure including a photoresist layer, an SiON layer, and an amorphous carbon layer. Another mask is formed by lithography technology.

Next, in the plasma processing method, a second etching process is executed. The second etching process may be a type of direct plasma processing process. In the second etching process, the plasma processing device 1 or the plasma processing device 1B is used. Further, when a process before the second etching process is executed by using a different device from the plasma processing device 1 or the plasma processing device 1B, the substrate preparation process is executed just before the second etching process. In the substrate preparation process, the substrate 200 is prepared on the substrate support portion 16 as the substrate W.

In the second etching process, the multilayer film 202 is etched by the chemical species from the plasma generated from the processing gas in the second space S2, i.e., the direct plasma DP. Processing gas used in the second etching process is gas containing fluorine or hydrogen. For example, the processing gas contains fluorocarbon gas and hydrofluorocarbon gas. The processing gas may contain another gas such as rare gas. In the second etching process, the anisotropic etching of the multilayer film 202 is performed. In the second etching process, a hole 208 is formed in the multilayer film 202 as illustrated in FIG. 6E. In the second etching process, the second high-frequency power may be supplied to the electrode 16e in order to attract ions into the substrate 200.

Next, in the plasma processing method, a third etching process is executed. The third etching process may be a type of remote plasma processing process. In the third etching process, a plurality of second layers 204 is etched by the radicals from the plasma generated from the processing gas in the first space S1, i.e., the remote plasma RP. Processing gas used in the third etching process is gas containing fluorine or hydrogen. The processing gas includes, for example, $NF_3$, $H_2$, and $O_2$. Alternatively, the processing gas may include fluorocarbon, $N_2$, $H_2$, and $O_2$. In the third etching process, the plurality of second layers 204 is etched selectively or isotropically with respect to the plurality of first layers 203 as illustrated in FIG. 6F.

Next, in the plasma processing method, a second film forming process is executed. The second film forming process includes a precursor gas supply process and a remote plasma processing process. In the precursor gas supply process in the second film forming process, precursor gas is supplied to the substrate 200. The precursor gas is gas including a precursor. The precursor contains silicon. The precursor includes, for example, aminosilane. The aminosilane may be, for example, bistertbutylaminosilane (BTBAS), The aminosilane may be bisdiethylaminosilane (BDEAS), bis-methylaminosilane (BDMAS), di-isopropylamino silane (DIPAS), or bisethylaminosilane (BEMAS). In the precursor gas supply process in the second film forming process, the precursor in the precursor gas is adsorbed on the surface of the substrate 200.

In the remote plasma processing process in the second film forming process, plasma, i.e., the remote plasma RP is generated in the region R1. The remote plasma RP is formed by reforming gas. The reforming gas is oxygen contained gas. In this process, oxygen radicals from the remote plasma RP are supplied to the second space S2 and oxidize the precursor. As a result, as illustrated in FIG. 7A, a silicon oxide film is formed in the hole 208, and a region of the plurality of first layers 203 is enlarged. The silicon oxide film formed in the second film forming process provides a tunnel oxide film 209.

Further, in the second film formation process, the precursor gas supply process and the remote plasma processing process may be repeated alternately. Further, the second film forming process may include a purge process between the precursor gas supply process and the remote plasma processing process, and between the remote plasma processing process and the precursor gas supply process. In the purge process, a purge in the chamber 10 is performed.

Next, in the plasma processing method, a third film forming process is executed. The third film forming process includes a precursor gas supply process and a remote plasma processing process. In the precursor gas supply process in the third film forming process, precursor gas is supplied to the substrate 200. The precursor gas is gas including a precursor. The precursor contains silicon. The precursor includes, for example, aminosilane. The aminosilane is, for example, bistertbutylaminosilane (BTBAS). The aminosilane may be bisdiethylaminosilane (BDEAS), bismethyl-aminosilane (BDMAS), di-isopropylamino silane (DIPAS), or bisethylaminosilane (BEMAS). In the precursor gas supply process in the third film forming process, the precursor in the precursor gas is adsorbed on the surface of the substrate 200.

In the remote plasma processing process in the third film forming process, plasma, i.e., the remote plasma RP is generated in the region R1. The remote plasma RP is formed by reforming gas. The reforming gas is nitrogen contained gas. The nitrogen contained gas is $N_2$ gas or $NH_3$ gas. In this process, nitrogen radicals from the remote plasma RP are supplied to the second space S2 and nitrate the precursor. As a result, a silicon nitride film 210 is formed on the surface of the substrate 200 as illustrated in FIG. 7B. The silicon nitride film 210 may be a charge trap film.

Further, in the third film formation process, the precursor gas supply process and the remote plasma processing process may be repeated alternately. Further, the third film forming process may include a purge process between the precursor gas supply process and the remote plasma processing process, and between the remote plasma processing process and the precursor gas supply process. In the purge process, a purge in the chamber 10 is performed.

Next, in the plasma processing method, a fourth film forming process is executed. In the fourth film forming process, a high dielectric film 211 is formed on the surface of the substrate 200 as illustrated in FIG. 7C. The fourth film forming process is executed by using the plasma processing device 1 or the plasma processing device 1B. The fourth film forming process includes a precursor gas supply process and a remote plasma processing process. That is, in the fourth film forming process, the precursor is adsorbed on the surface of the substrate 200 in the precursor gas supply process and the precursor is reformed by the radicals from the remote plasma RP in the remote plasma processing process. As a result, the high dielectric film 211 is formed. Further, in the fourth film formation process, the precursor gas supply process and the remote plasma processing process may be repeated alternately. Further, the fourth film forming process may include the purge process between the precursor gas supply process and the remote plasma processing process, and between the remote plasma processing process and the precursor gas supply process. In the purge process, the purge in the chamber 10 is performed.

Next, in the plasma processing method, a second embedding process is executed. In the second embedding process, a region 212 is formed on the surface of the high dielectric film 211. In the second embedding process, a space in the substrate 200 is buried in the region 212 as illustrated in FIG. 7D. The region 212 is made of, for example, tantalum. The region 212 may be formed by the CVD method or the ALD method.

Next, in the plasma processing method, a fourth etching process is executed. The fourth etching process may be a type of direct plasma processing process. In the fourth etching process, the region 212 is etched by the chemical species the plasma generated from the processing gas in the second space S2, i.e., the direct plasma DP. In the fourth etching process, the region 212 is formed in a hole 208 as illustrated in FIG. 7E. In the fourth etching process, the second high-frequency power may be supplied to the electrode 16e in order to attract ions into the substrate 200. Further, the first etching process may be executed by using a plasma processing device different from the plasma processing device 4 or the plasma processing device 1B.

Figure 8:
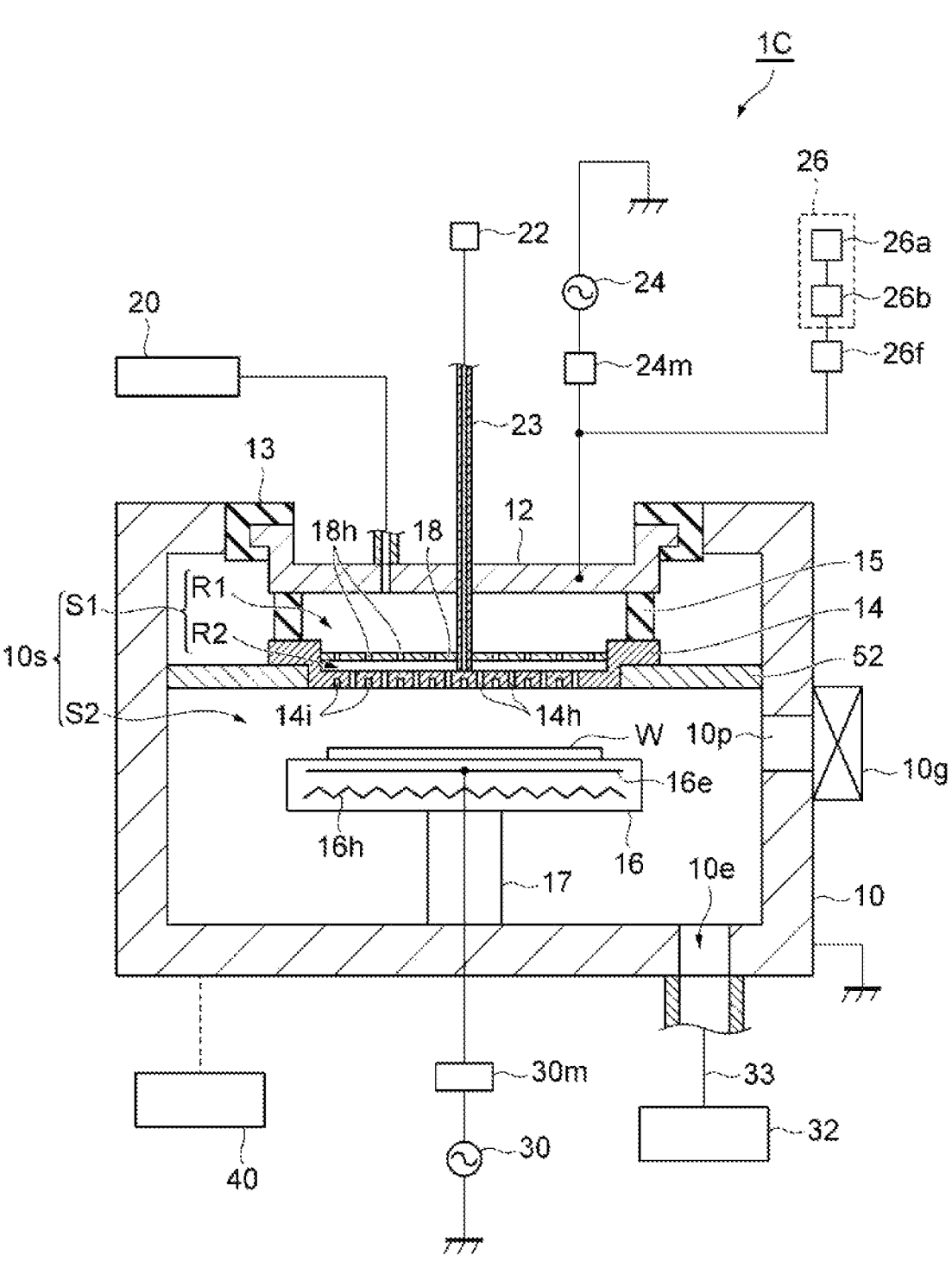
FIG. 8 is a diagram schematically illustrating a plasma processing device according to yet another exemplary embodiment.
Figure 9:
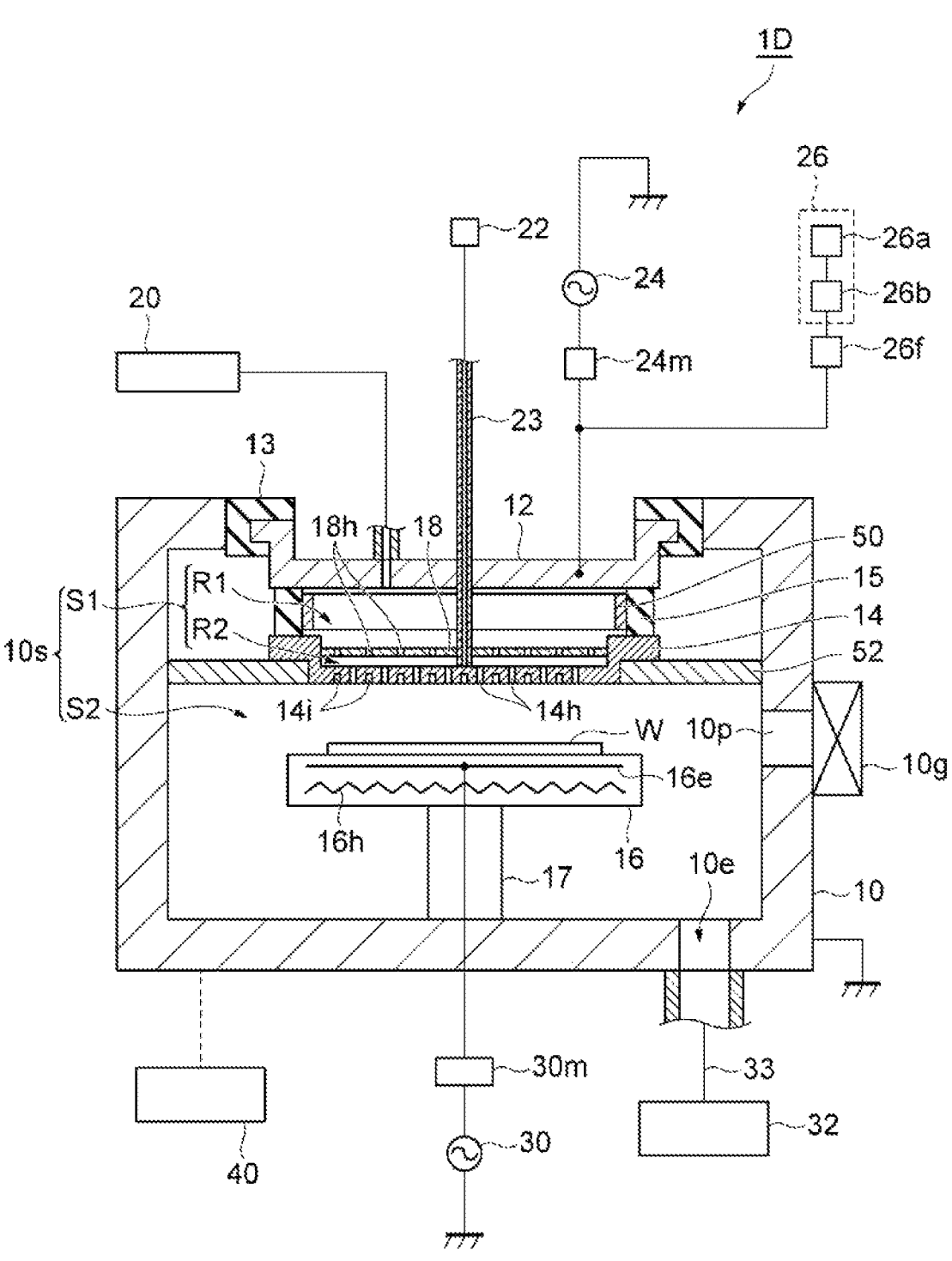
FIG. 9 is a diagram schematically illustrating a plasma processing device according to still yet another exemplary embodiment.

Hereinafter, FIGS. 8 and 9 are referenced. Each of FIGS. 8 and 9 is a diagram schematically illustrating a plasma processing device according to yet another exemplary embodiment. A plasma processing device 1C illustrated in FIG. 8 and a plasma processing device 1D illustrated in FIG. 9 may be used in the plasma processing methods according to various embodiments and various examples described above, respectively. Hereinafter, a difference of the plasma processing device 1C from the plasma processing device 1 will be described. Further, a difference of the plasma processing device 1D from the plasma processing device 1B will be described.

In the plasma processing device 1C and the plasma processing device 1D, the shower head 14 is grounded. The shower head 14 may be grounded through the member 52 and the chamber 10. The member 52 may be made of metal such as aluminum. The member 52 may have a ring shape. The member 52 is extended between a peripheral portion of the shower head 14 and the side wall of the chamber 10 so as to connect the peripheral portion of the shower head 14 and the side wall of the chamber 10. The member 52 prevents the plasma from being spread to an upper side of the member 52 or the side of the first space (or the side of the member 15).

In the plasma processing device 1C and the plasma processing device 1D, one or both of the high-frequency power source 24 and the DC pulse power source constitute a first power source. One or both of the first high-frequency power from the high-frequency power source 24 and the pulse-shaped DC voltage from the DC pulse power source 26 are supplied to the upper electrode 12 as the first power in order to generate the remote plasma RP in the region R1.

In the plasma processing device 1C and the plasma processing device 1D, the high-frequency power source 30 constitutes a second power source. The second high-frequency power from the high-frequency power source 30 is supplied to the electrode 16e in order to generate the direct plasma DP in the second space S2.

In the plasma processing device 1C and the plasma processing device 1D, when the substrate W is processed by using the radicals supplied to the second space S2 from the remote plasma RP generated in the region R1, the gas from the first gas supply portion 20 is supplied to the region R1. Further, the exhaust device 32 reduces a pressure inside the internal space 10s to a specified pressure. In addition, one or both of the first high-frequency power and the pulse-shaped DC voltage are given to the upper electrode 12. To this end, the controller 40 may control the first gas supply portion 20, the high-frequency power source 24, the DC pulse power source 26, and the exhaust device 32.

In the plasma processing device 1C and the plasma processing device 1D, when the substrate W is processed by using the chemical species from the direct plasma DP generated in the second space S2, the gas from the second gas supply portion 22 is supplied to the second space S2 from the shower head 14. Further, the exhaust device 32 reduces a pressure inside the internal space 10s to a specified pressure. In addition, the second high-frequency power is supplied to the electrode 16e. To this end, the controller 40 may control the second gas supply portion 22, the exhaust device 32, and the high-frequency power source 30.

Figure 10:
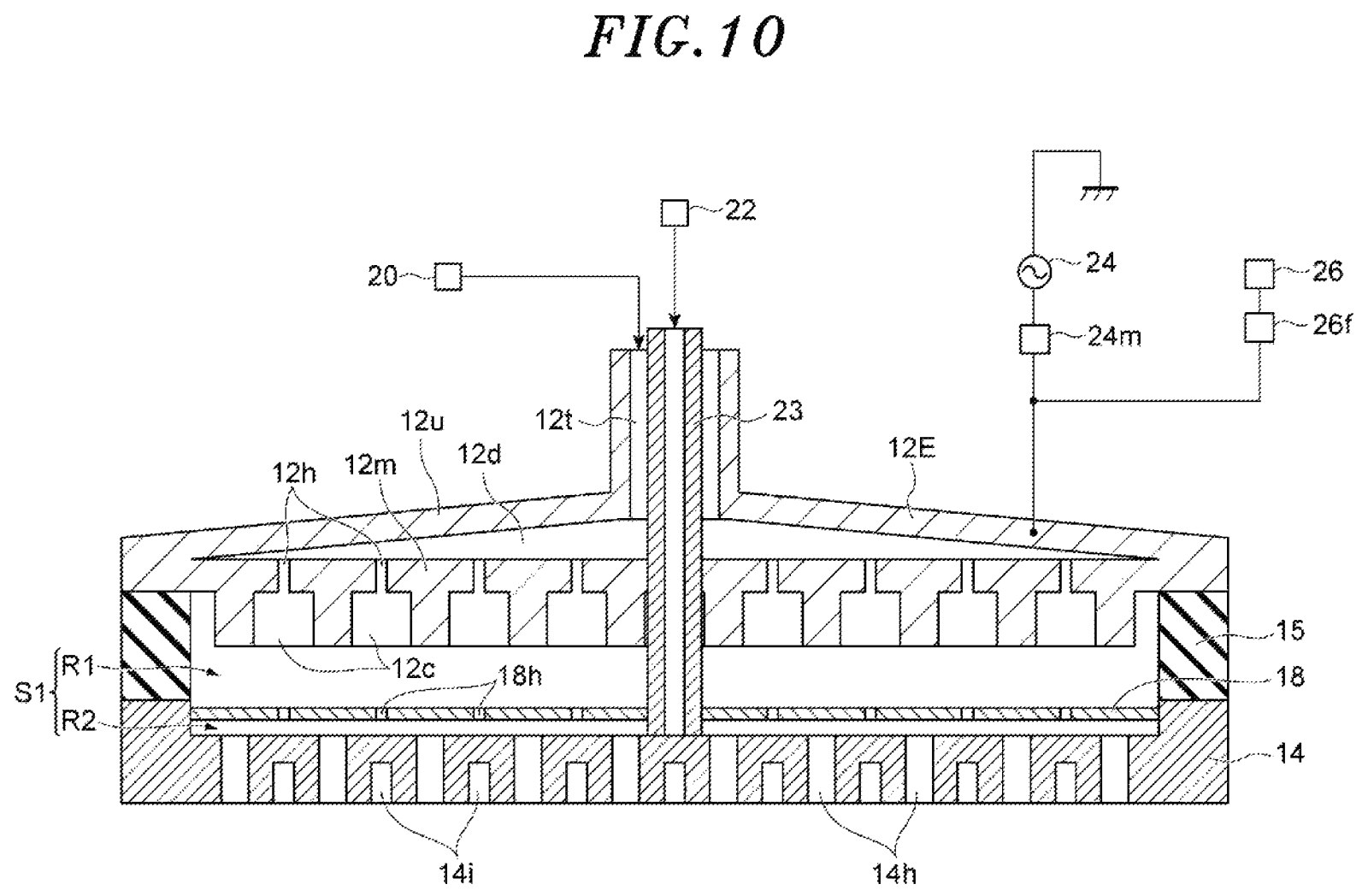

Hereinafter, FIG. 10, and FIGS. 11A to 11D are referenced. FIG. 10 is a diagram illustrating an upper electrode according to another exemplary embodiment. Each of FIGS. 11A to 11D is a plan view illustrating one or more cavities in the upper electrode according to another exemplary embodiment. An upper electrode 12E illustrated in FIG. 10 may be adopted instead of the upper electrode 12 in the plasma processing device 1, the plasma processing device 1B, the plasma processing device 1C, and the plasma processing device 1D.

The upper electrode 12E provides one or more cavities 12c. One or more cavities 12c are included in the region R1. In the illustrated example, the upper electrode 12E provides a plurality of cavities 12c. One or more cavities 12c of the upper electrode 12E is formed to generate hollow cathode discharge therein.

In one embodiment, the upper electrode 12E includes a main portion 12m. The main portion 12m has an approximately disk shape, and is extended above the shower head 14 and the ion trap 18 so as to partition the first space S1. The main portion 12m provides one or more cavities 12c. One or more cavities 12c are opened downward.

In one embodiment, the upper electrode 12E further provides a flow path 12t and a gas diffusion space 12d. The flow path 12t may be extended around the pipe 23. The flow path 12t is connected to the gas diffusion space 12d. The upper electrode 12E may further include a lid portion 12u. The lid portion 12u is provided on the main portion 12m so as to provide the gas diffusion space 12d between the main portion 12m and the lid portion 12u. The gas diffusion space 12d is connected to one or more cavities 12c through one or more holes 12h. One or more holes 12h are provided by the main portion 12m. The gas from the first gas supply portion 20 is supplied to one or more cavities 12c through the flow path 12t, the gas diffusion space 12d, and one or more holes 12h.

Figure 11:
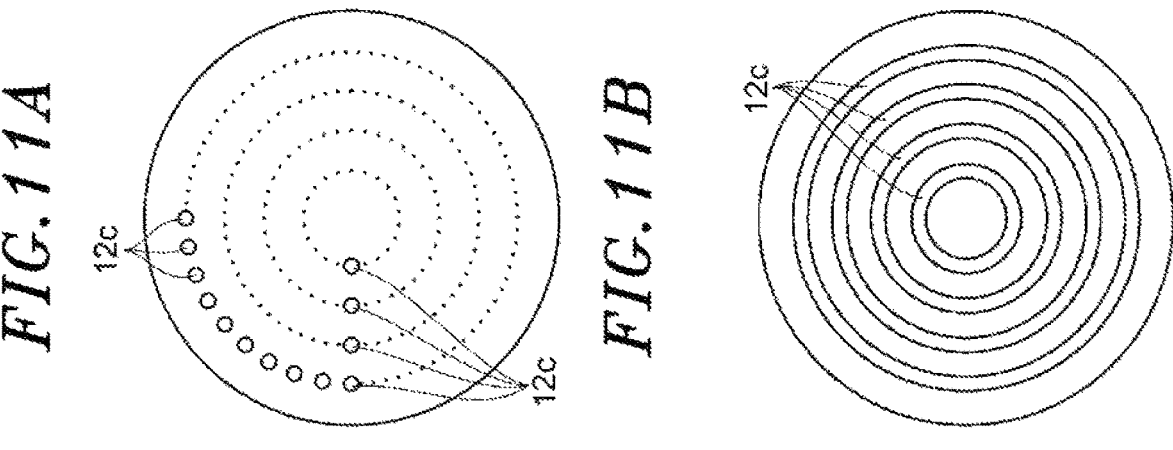

The upper electrode 12E may provide a plurality of holes arranged along one or more concentric circles as the plurality of cavities 12c as illustrated in FIG. 11A. That is, the plurality of cavities 12c may be a plurality of holes arranged in a circumferential direction around a central axis line. Each of the plurality of holes may have a circular planar shape. Alternatively, the upper electrode 12E may provide one or more ring-shaped grooves extended around the central axis line as one or more cavities 12c as illustrated in FIG. 11B. Alternatively, the upper electrode 12E may provide a plurality of holes arranged in a grid shape as the plurality of cavities 12c as illustrated in FIG. 11C. Alternatively, the upper electrode 12E may provide a plurality of first grooves 121 and a plurality of second grooves 122 opened downward as one or more cavities 12c as illustrated in FIG. 11D. Each of the plurality of first grooves 121 is extended in one direction. The plurality of second grooves 122 are extended in different directions to cross the plurality of first grooves 121, respectively.

Hereinafter, FIG. 12 is referenced. FIG. 12 is an enlarged cross-sectional view of one or more cavities in the upper electrode according to another exemplary embodiment. The gas from the first gas supply portion 20 is supplied to the inside of one or more cavities 12c, and when the first high-frequency power and/or the pulse-shaped DC voltage are given to the upper electrode 12E, the plasma PL is generated inside one or more cavities 12c.

Each of one or more cavities 12c has a width Wc and a depth Dc. The Wc may satisfy Wc>$\lambda$+2d$_s$. $\lambda$ represents an average free process of electrons and d$_s$ represents a thickness of a sheath. When argon gas is used as the processing gas in 133 Pa (1 Torr) and 200° C., $\lambda$ is 0.44 mm. Further, when an electron density is $1\times10^{11}$ cm$^{-3}$, a sheath potential is 100 V, an electron temperature is 3 eV, d$_s$ is 2.6 mm. Further, the electron density and the sheath potential are values derived when the first high-frequency power has a frequency of 450 kHz and a power level of 500 W, and the pressure of the argon gas is 133 Pa (1 Torr). Therefore, the width We is, for example, 6 mm or more. The depth Dc is, for example, approximately 10 mm.

By the upper electrode 12E, high-density remote plasma may be generated by the hollow cathode discharge. Therefore, it is possible to supply a large quantity of radicals to the substrate W disposed in the second space S2 from the remote plasma.

Hereinabove, various embodiments have been described, but the present disclosure is not limited to the exemplary embodiment, but various additions, omissions, substitutions, and changes may be made. Further, it is possible to form another embodiment by combining elements in different embodiments.

For example, even when any one of plasma processing by the remote plasma RP and the direct plasma DP is generated, the gas may be supplied from both of the first gas supply portion 20 and the second gas supply portion 22.

For example, the plasma processing device 1, the plasma processing device 1B, the plasma processing device 1C, and the plasma processing device 1D may be configured to perform cleaning of the chamber 10 by using the radicals from the remote plasma RP.

From the above description, it will be understood that various embodiments of the present disclosure are described in the present specification for the purpose of the description, and that various changes can be made without departing from the scope and the spirit of the present disclosure. Therefore, it is not intended to limit the various embodiments disclosed in the present specification, and the true scope and spirit are indicated by the appended claims.

DESCRIPTION OF REFERENCE NUMERALS

1: Plasma processing device
10: Chamber
12: Upper electrode
14: Shower head
16: Substrate support portion
18: Ion trap
20: First gas supply portion
22: Second gas supply portion
24: High-frequency power source
26: DC pulse power source
28: Switch

The invention claimed is:
1. A plasma processing device comprising:
a chamber;
an upper electrode;
a showerhead provided below the upper electrode, which
   divides an internal space of the chamber into a first
   space between the upper electrode and the showerhead
   and a second space below the showerhead, wherein the
   showerhead provides a plurality of introduction ports
   for introducing a gas into the second space and a
   plurality of openings penetrating the showerhead so that the first space and the second space are in communication with each other;

a substrate support portion configured to support a substrate in the second space;

an ion trap made of a dielectric and provided between the upper electrode and the showerhead, wherein the ion trap provides a plurality of through holes arranged not to align with the plurality of openings of the showerhead;

a first gas supply portion configured to supply a gas to a region in the first space between the upper electrode and the ion trap;

a second gas supply portion configured to supply the showerhead with a gas to be introduced from the plurality of introduction ports into the second space;

a conductive member extended directly on a lateral side of the region in the first space, configured to be exposed to the gas in the region in the first space, and electrically connected to the showerhead;

a power source configured to produce a power for generating plasma, and connected to the upper electrode; and a switch configured to switchably connect the showerhead to one of a ground and the upper electrode.

2. The plasma processing device of claim 1, wherein the ion trap is made of a conductive material, and is electrically connected to the showerhead.

3. The plasma processing device of claim 1, further comprising:

a controller, wherein the controller is configured to:

control the switch so as to connect the showerhead to the ground, control the first gas supply portion so as to supply a processing gas to the region in the first space, and control the power source so as to supply the power to the upper electrode, in order to generate plasma in the first space and supply radicals from the plasma to the second space; and control the switch so as to connect the showerhead to the upper electrode, control the second gas supply portion so as to introduce the processing gas into the second space through the plurality of introduction ports of the showerhead, and control the power source so as to supply the power to the upper electrode, in order to generate plasma in the second space.

4. A plasma processing device comprising:

a chamber;

an upper electrode;

a showerhead provided below the upper electrode, which divides an internal space of the chamber into a first space between the upper electrode and the showerhead and a second space below the showerhead, wherein the showerhead provides a plurality of introduction ports for introducing a gas into the second space and a plurality of openings penetrating the showerhead so that the first space and the second space are in communication with each other, the showerhead being grounded;

a substrate support portion including an electrode and configured to support a substrate in the second space;

an ion trap made of a dielectric and provided between the upper electrode and the showerhead, wherein the ion trap provides a plurality of through holes arranged not to align with the plurality of openings of the showerhead;

a first gas supply portion configured to supply a gas to a region in the first space between the upper electrode and the ion trap;

a second gas supply portion configured to supply the showerhead with a gas to be introduced from the plurality of introduction ports into the second space;

a conductive member extended directly on a lateral side of the region in the first space, configured to be exposed to the gas in the region in the first space, and electrically connected to the showerhead;

a first power source configured to produce a first power for generating plasma, and connected to the upper electrode; and a second power source configured to produce a second power for generating plasma, and connected to the electrode of the substrate support portion.

5. The plasma processing device of claim 4, wherein the first space includes one or more cavities provided by the upper electrode, and plasma is generated in the first space by hollow cathode discharge in the one or more cavities.

6. The plasma processing device of claim 5, wherein the upper electrode provides one or more grooves which are opened downward as the one or more cavities, and each of the one or more grooves has a ring shape, and extends around a central axial line extending in a vertical direction.

7. The plasma processing device of claim 5, wherein the upper electrode provides a plurality of first grooves and a plurality of second grooves opened downward as the one or more cavities, and each of the plurality of first grooves extends in one direction and each of the plurality of second grooves extends in a different direction to cross the plurality of first grooves.

8. The plasma processing device of claim 5, wherein the upper electrode provides a plurality of holes opened downward as the one or more cavities, and the plurality of holes are arranged in a circumferential direction around the central axis line extending in the vertical direction or in a grid shape.

9. The plasma processing device of claim 4, wherein the ion trap is made of a conductive material, and electrically connected to the showerhead.

10. The plasma processing device of claim 4, further comprising:

a controller, wherein the controller is configured to:

control the first gas supply portion so as to supply a processing gas to the region in the first space, and control the first power source so as to supply the first power to the upper electrode, in order to generate plasma in the first space and supply radicals from the plasma to the second space; and control the second gas supply portion so as to introduce the processing gas into the second space through the plurality of introduction ports of the showerhead, and control the second power source so as to supply the second power to the electrode of the substrate support portion, in order to generate plasma in the second space.

* * * * *